US009411018B2

United States Patent
Stark

(10) Patent No.: US 9,411,018 B2
(45) Date of Patent: Aug. 9, 2016

(54) VOLTAGE MONITORING DEVICE

(71) Applicant: Samsung SDI Co., Ltd., Yongin-si, Gyeonggi-do (KR)

(72) Inventor: Johann Stark, Nestelbach bei Graz (AT)

(73) Assignee: Samsung SDI Co., Ltd., Yongin-si (KR)

( * ) Notice: Subject to any disclaimer, the term of this patent is extended or adjusted under 35 U.S.C. 154(b) by 537 days.

(21) Appl. No.: 13/892,262

(22) Filed: May 11, 2013

(65) Prior Publication Data

US 2014/0077819 A1 Mar. 20, 2014

(30) Foreign Application Priority Data

Sep. 19, 2012 (EP) ..................................... 12185021

(51) Int. Cl.
*G01R 31/36* (2006.01)
*H01M 10/48* (2006.01)

(52) U.S. Cl.
CPC ........ *G01R 31/3606* (2013.01); *G01R 31/3696* (2013.01); *H01M 10/482* (2013.01)

(58) Field of Classification Search
CPC .......... G01R 31/3606; G01R 31/3696; H01M 10/482
USPC ........................................................ 324/434
See application file for complete search history.

(56) References Cited

U.S. PATENT DOCUMENTS

| 6,168,470 | B1* | 1/2001 | Ikeda ................... H01M 2/1083 439/620.08 |
| 2005/0110458 | A1 | 5/2005 | Brotto et al. |
| 2010/0104932 | A1* | 4/2010 | Heidenbauer ....... H01M 2/1077 429/99 |
| 2011/0045329 | A1 | 2/2011 | Aoki et al. |

FOREIGN PATENT DOCUMENTS

| AT | 9790 U1 | 3/2008 |
| DE | 19847190 A1 | 6/1999 |
| DE | 102009050315 A1 | 4/2011 |
| EP | 2 530 777 A2 | 12/2012 |
| WO | 2012085562 A1 | 6/2012 |

* cited by examiner

*Primary Examiner* — Thomas F Valone
(74) *Attorney, Agent, or Firm* — Lewis Roca Rothgerber Christie LLP

(57) ABSTRACT

Device to monitor the voltage of battery cells. The device includes a control device, voltage taps configured to tap the voltages of the battery cells, a holding plate having a first holding plate part and a second holding plate part, and a stamped-out circuit having measuring lines configured to electrically connect the control device to the voltage taps, the stamped-out circuit being arranged in cut-outs of the first holding plate part and the cut-outs being covered by the second holding plate such that the measuring lines are fixedly positioned in the cut-outs.

19 Claims, 4 Drawing Sheets

VOLTAGE MONITORING DEVICE

CROSS-REFERENCE TO RELATED APPLICATIONS

The present application claims priority under 35 U.S.C. §119 to European Patent Application No. 12 185 021.8 (filed on Sep. 19, 2012), which is hereby incorporated by reference in its entirety.

TECHNICAL FIELD

Embodiments are related to a device which monitors the voltage of battery cells, the device including a control device, voltage taps configured to tap the voltages of battery cells, and measuring lines configured to electrically connect the control device to the voltage taps, the measuring lines configured as a stamped-out circuit.

In accordance with embodiments, high voltage battery systems that are embodied from a plurality of, for example, lithium ion cells generally operate by way of monitoring the voltage of the individual battery cells, and also comprise a device for balancing the voltages of the various battery cells ("load balancing"). The cell voltages are tapped either directly at cell terminals or also at cell connectors.

BACKGROUND

German Patent Publication No. DE 198 47 190 A1 discloses, for example, a connecting plate for a battery holder that is embodied as a moulded resin board, having conductor rails that are moulded into the plate and having voltage measuring connections and wires for measuring the voltages of batteries. The position of the conductor rails is fixed by way of the fact that they are moulded into the plate. The wires are routed out from the connecting plate and can lead to an electronic control unit (ECU) that is to be connected.

U.S. Patent Publication No. 2011/0045329 A1 discloses the use of connection pieces, wherein in each case one end of a connection piece can be connected to a conductor rail and the second end can be connected to a wire by way of press-contact blades, wherein the wires, in turn, can be connected to a voltage measuring device.

German Patent Publication No. DE 10 2009 050 315 A1 discloses a connecting device for connecting in an electrically conducting manner a plurality of cell terminals of cells. The device comprises printed circuit board tracks that are connected as one piece to cell connectors. The cell connectors that are mutually connected as one piece form a connector assembly that can be handled as one unit and can be presented as one unit to the electrochemical cells that are to be mutually connected. Connecting webs that mutually connect the cell connectors of the connector assembly can be removed once the cell connectors have been fixed to the respective cell terminals that are to be mutually connected. The cell connectors can be held on an underframe that also supports the printed circuit board tracks. The free ends of the printed circuit board tracks, which ends are remote from the cell connectors, are connected to a connecting web in an electrically conductive manner, which connecting web can be replaced by a male connector of a cable connection that leads to a control unit.

A disadvantage of the known solutions resides in the fact that they are complicated and expensive to produce, for example, owing to the fact that it is necessary for the connections between the cell connectors and the measuring lines to be produced subsequently and in a reliable process and/or owing to the fact that it is necessary to handle elements such as printed circuit board tracks or cell connectors that do not have a precisely fixed position.

SUMMARY

In accordance with embodiments, an enhanced devices to monitor the voltage of battery cells that may be manufactured in a simple manner and can perform its function in a reliable manner.

In accordance with embodiments, a device to monitor the voltage of battery cells includes at least one of the following: a control device, voltage taps configured tap the voltages of the battery cells, and measuring lines configured to electrically connect the control device to the voltage taps, the measuring lines also configured as a stamped-out circuit integrated into an at least two-part holding plate in such a manner that the stamped-out circuit lies in cut-outs of the first holding plate part, which cut-outs correspond to the shape of the stamped-out circuit, and the second holding plate part covers the cut-outs so that the measuring lines are fixed in position in the cut-outs.

A holding plate in accordance with embodiments thus comprises at least two holding plate parts and a stamped-out circuit placed in the first holding plate part in cut-outs that match or otherwise correspond to the stamped-out circuit. The topology of the measuring lines is created by removing appropriate webs from the stamped-out circuit. The measuring lines are also fixed in their position in the third dimension (perpendicular to the extension plane of the holding plate) by placing the second holding plate part on the first holding plate part. The remaining measuring lines are positioned securely in their cut-outs even after the webs have been removed.

In addition, the measuring lines are well insulated in an electrical manner on all sides by virtue of the fact that the measuring lines are laid in the cut-outs of the first holding plate part and the measuring lines are covered by the second holding plate part.

In accordance with embodiments, a device to monitor the voltage of battery cells includes at least one of the following: a control device; voltage taps configured to tap the voltages of the battery cells; holding plate having a first holding plate part and a second holding plate part; and a stamped-out circuit having measuring lines configured to electrically connect the control device to the voltage taps, the stamped-out circuit being arranged in cut-outs of the first holding plate part and the cut-outs being covered by the second holding plate such that the measuring lines are fixedly positioned in the cut-outs.

In accordance with embodiments, a device to monitor the voltage of battery cells includes at least one of the following: a control device; voltage taps configured to tap the voltages of the battery cells; and measuring lines configured to electrically connect the control device to the voltage taps, wherein the measuring lines comprise a stamped-out circuit structurally integrated in an at least holding plate having a first holding plate part and a second holding plate part, the stamped-out circuit being arranged in cut-outs of the first holding plate part that correspond to the shape of the stamped-out circuit, and the second holding plate part being configured to cover the cut-outs so that the measuring lines are fixed in position in the cut-outs.

Further developments of embodiments are described in the dependent claims, the description and also the attached drawings.

In accordance with embodiments, the voltage taps also lie in the cut-outs of the first holding plate part. The cut-outs are formed in such a manner that both the measuring lines and also the voltage taps, in particular the cell connectors, are securely positioned in the cut-outs. The cell connectors are connected to ends of the measuring lines in a positive-locking manner, a non-positive locking manner or by way of a material connection or the cell connectors are also embodied as one piece with the measuring lines.

In accordance with embodiments, the voltage taps are held by elastic holding elements in the cut-outs of the first holding plate part. In particular, in the vertical position, perpendicular to the extension plane of the holding plate, of the voltage taps is fixed by the elastic holding elements. It is ensured by virtue of the elasticity that the voltage taps have a limited movement, for example, for compensating for manufacturing tolerances.

In accordance with embodiments, the voltage taps are also covered at least partially by the second holding plate part. As a consequence, in particular any unintentional contacting of the voltage taps from the outside is prevented.

It is preferred that the second holding plate part comprises maintenance orifices in the region of the voltage taps. It is possible by the maintenance orifices, even after having attached the second holding plate part, to produce a material connection between the voltage taps and the cell terminals, for example, using a welding robot during the manufacturing process or even when eliminating a subsequent malfunction.

In accordance with embodiments, the second holding plate part comprises ventilation orifices.

In accordance with embodiments, the control device is integrated in the two-part holding plate, whereby in particular the control device lies on the first holding plate part. The control device is as a consequence likewise supported and protected by the two-part holding plate.

In accordance with embodiments, the second holding plate part comprises a control device orifice in the region of the control device.

In accordance with embodiments, the control device is directly connected by a plug connection to control device-side ends of the measuring lines. The control device may be inserted in this manner for assembly purposes in a simple manner into the ends of the measuring lines. The control device-side ends of the measuring lines lie for this purpose preferably in a common end plane in order to form a one-part or a multiple-part interface.

In accordance with embodiments, the control device-side ends of the measuring lines are routed out of the first holding plate part and terminate at the level of the second holding plate part.

In accordance with embodiments, the control device-side ends of the measuring lines are embodied as male connectors of the plug connection and female connectors of the plug connection are embodied on the control device.

In accordance with embodiments, the second holding plate part comprises a stop in the region of the control device in order to block any horizontal displacement of the control device. In particular, it is possible while producing the plug connection between the control device and the ends of the measuring lines to prevent or reduce the displacement of the control device and/or to prevent or reduce the extent to which the ends of the measuring lines are pushed away.

DRAWINGS

Embodiments are described by way of example below with reference to the drawings.

DESCRIPTION

Figure 1:
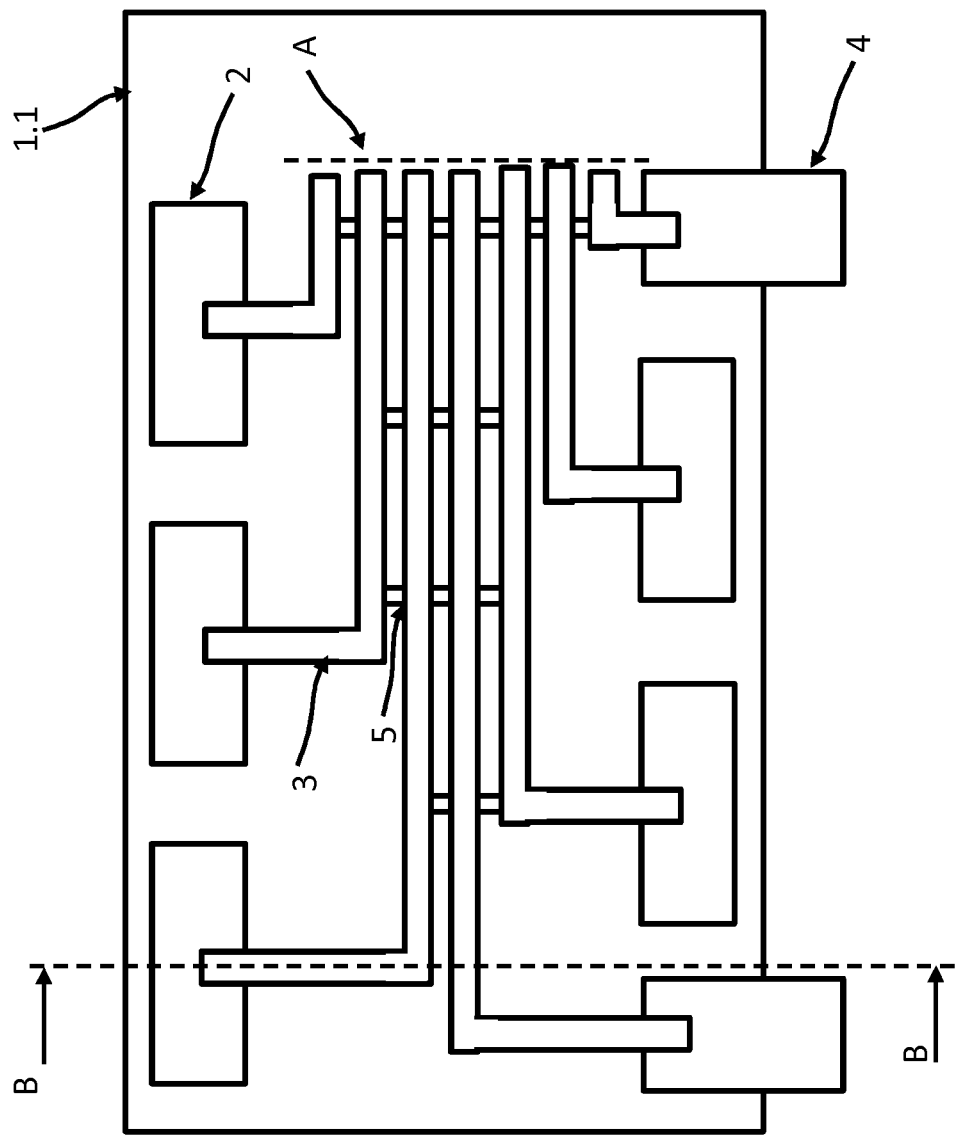
FIG. 1 illustrates a plan view of a device without the second holding plate part, in accordance with embodiments.

FIG. 1 illustrates a top view of a device in accordance with embodiments. FIG. 1 illustrates the device having only the first holding plate part 1.1 without the second holding plate part 1.2 in place. A plurality of voltage taps 2 and measuring lines 3 are placed in cut-outs, not visible here, of the first holding plate part 1.1. The measuring lines 3 together with, the connecting webs 5 that are connected to the measuring lines 3 form a stamped-out circuit. Any connecting webs 5 that are not required are removed prior to starting the operation of the device in accordance with embodiments. The voltage tap of the entire battery system is performed at the battery voltage taps 4.

In each case, one end of the measuring lines 3 is embodied for this purpose in such a manner that they are electrically conductively connected in a positive-locking manner or by way of a material connection to a voltage tap 2, in particular, to the cell connectors or also to the battery voltage taps.

Depending upon the materials that are used for the cell terminals and cell connectors, a changeover in material can occur along the section from the cell terminal and/or voltage tap 2 towards the common end plane A, for example, when the cell connector is embodied from aluminium and the plug connector of the common end plane A is embodied from copper. The changeover in material advantageously occurs within the cut-outs of the first holding part 1.1, for example, within the measuring lines 3 or in a connection piece between the measuring line 3 and the voltage tap 2. The different materials are then joined together, for example, by welding, soldering, clinching, screws, rivets, clamps or roll cladding.

The control device-side ends 12 of the measuring lines 3 lead to a common end plane A that facilitates the plug connection to a corresponding counter piece on the control device 14.

Particularly in the case of embodiments having a narrow installation space, it is feasible to arrange one or more further holding plate parts 1.1 in further vertical planes, which in turn receive measuring lines 3 in respective cut-outs 8.1, 8.2, 8.3. The control device-side ends 12 of measuring lines 3 of further planes of this type are likewise routed, in a height-offset manner, towards the common end plane A. The connecting webs 5 are advantageously arranged lying precisely one on top of the other, so that the connecting webs 5 can be separated in a single operational step. When forming a stack of a plurality of layers of holding plate parts 1.1 care is to be taken that none of the ventilation orifices are covered.

Figure 2:
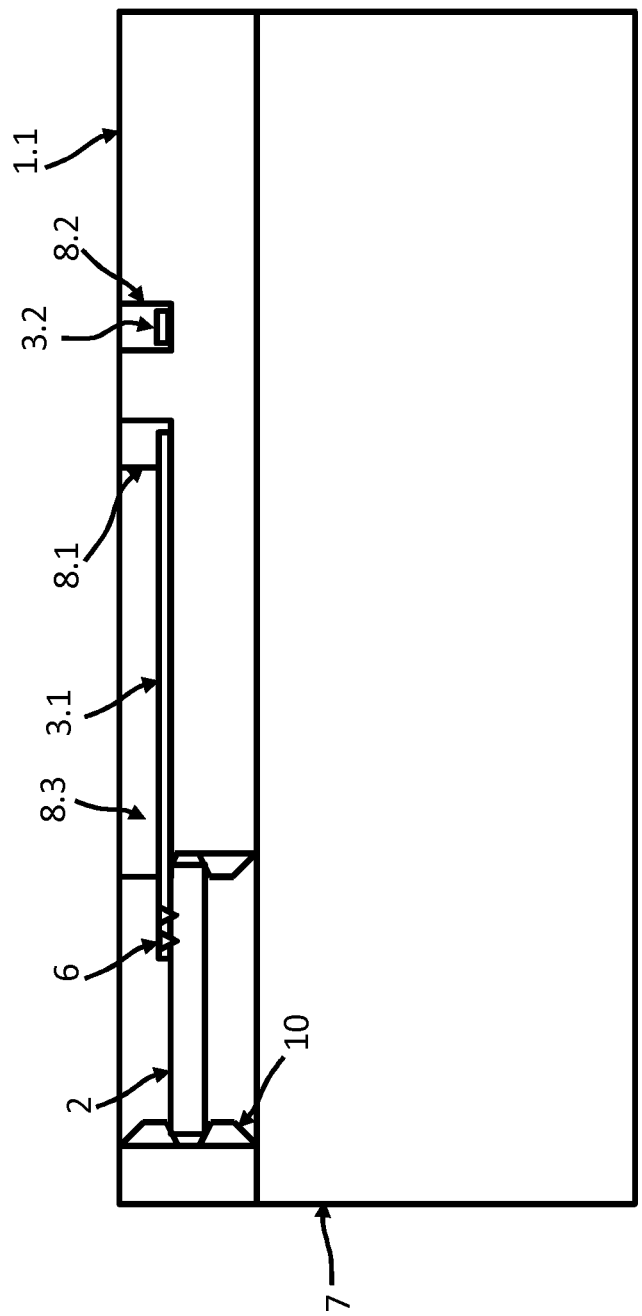
FIG. 2 illustrates a sectional view of the device in accordance with B-B of FIG. 1.

FIG. 2 illustrates a sectional view in accordance with B-B of FIG. 1. The first holding plate part 1.1 lies on a housing of battery cells 7. The battery cells and their connection terminals are not illustrated in further detail in FIG. 2. The holding plate 1.1, 1.2 is preferably manufactured from an electrically insulating material so that it is not necessary to provide an electrically insulating coating. The voltage taps 2 are held in the first holding plate part 1.1 by way of elastic holding elements 10 in the form of protrusions. The extent to which the voltage taps 2 can move in the first holding plate part 1.1 is limited by way of holding the voltage taps in this manner.

Manufacturing and assembly tolerances of the battery cells in the housing 7 and of the first holding plate part 1.1 can thus be compensated for in a simple manner.

A first measuring line 3.1 that is connected to a voltage tap 2 by way of a weld joint 6 lies in a cut-out 8.1, 8.3. A second measuring line 3.2 is arranged in a cut-out 8.2 that is intended for the measuring line. Each measuring line 3 and the connecting webs 5 lie in respective cut-outs 8.1, 8.2, 8.3 that are tailored in each case to suit the shape of the stamped-out circuit. The measuring lines 3 are spatially separated from each other by way of the holding plate 1.1, 1.2 and are therefore protected against electrical short circuits. As an alternative to the weld joint 6, the connection can also be provided, for example, by way of clinching, soldering, screws or clamps.

Figure 3:
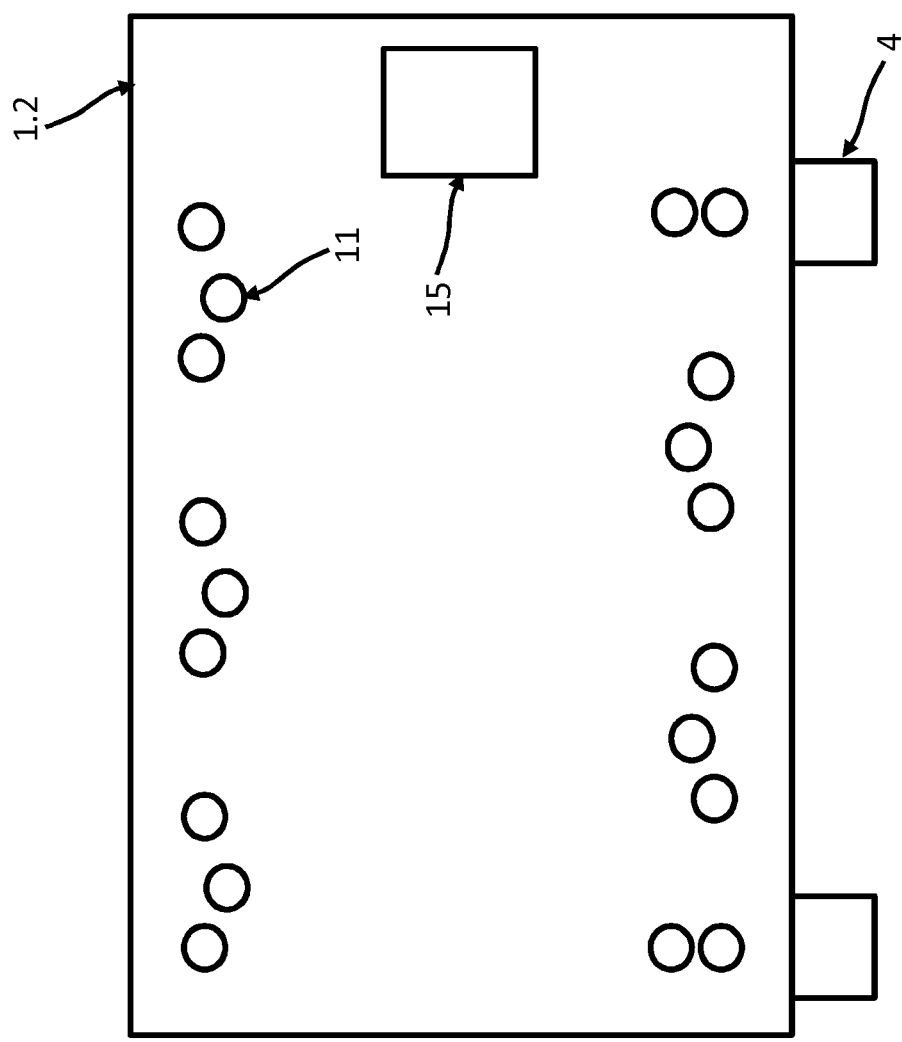
FIG. 3 illustrates a view corresponding to that of FIG. 1 with the second holding plate part.

FIG. 3 illustrates exclusively the second holding plate part 1.2 that is likewise embodied from an electrically insulating material. The second holding plate part 1.2 comprises maintenance orifices 11, through which a welding robot can produce the material connection between cell terminals and the voltage taps 2 and between the voltage taps 2 and the measuring lines 3. Furthermore, a control device orifice 15 is provided in the second holding plate part 1.2 through which the control device 14 can be mounted and/or maintained.

Figure 4:
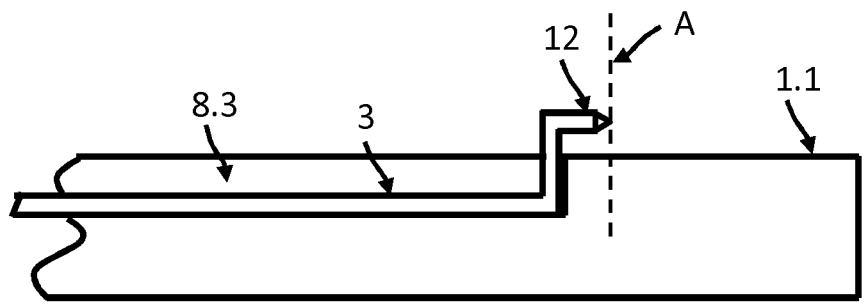
FIG. 4 illustrates a detailed lateral view of FIG. 1 in the region of the common end plane A.
Figure 5:
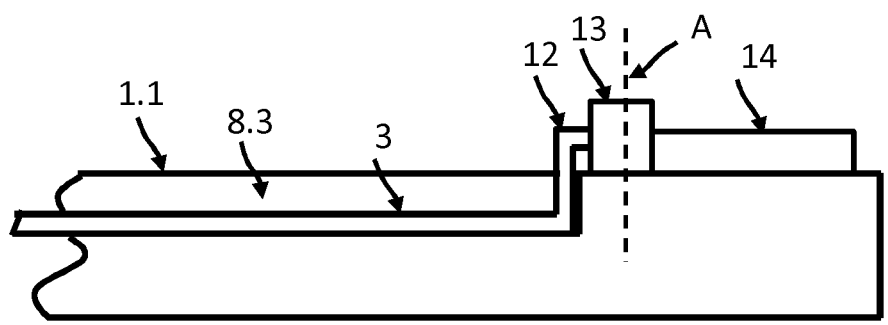
FIG. 5 illustrates a detailed lateral view of FIG. 1 in the region of the common end plane A.
Figure 6:
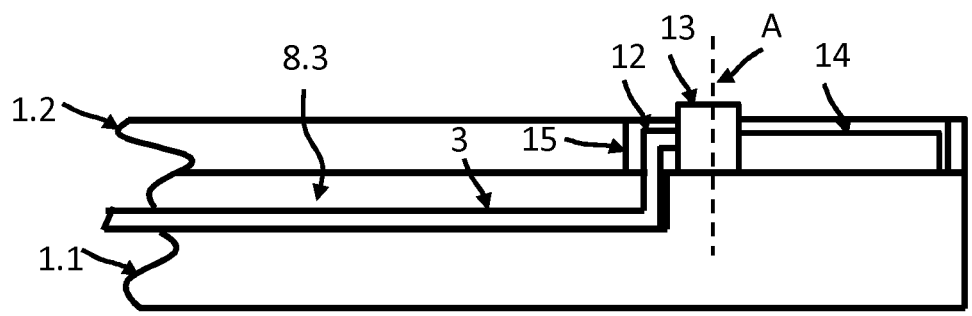
FIG. 6 illustrates a detailed lateral view of FIG. 1 in the region of the common end plane A.

FIGS. 4-6 illustrate in each case a sectional detailed view of the control device-side ends 12 of the measuring lines 3 in the region of the common end plane A. FIG. 4 illustrates only the first holding plate part 1.1 without the control device 14. FIG. 5 illustrates the first holding plate part 1.1 with the control device 14. FIG. 6 illustrates in addition the second holding plate part 1.2 in place on the first holding plate part. The free end of the measuring lines 3 is offset in the region of the common end plane A in each case. This control device-side end 12 of the measuring lines 3 is prepared for the purpose of being inserted in the female connectors 13 of a plug connector on the control device 14. In order to ensure a reliable electrical contact, the control device-side ends 12 of the measuring lines 3 can comprise a surface coating (e.g., nickel, brass).

The second holding plate part 1.2 comprises, as is evident in FIG. 6, a stop that is formed by way of the edge of the control device orifice 15. The stop prevents the control device-side ends 12 of the measuring lines 3 from greatly deforming as they are joined to the female connectors 13 of the plug connector.

The control device 14 is mechanically connected to the first holding plate part 1.1 in an appropriate manner, for example, by way of clips, screws or clamps.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device to monitor battery cell voltages, the device comprising:
    a control device configured to monitor battery cells;
    voltage taps configured to tap voltages of the battery cells;
    a holding plate comprising first and second holding plates, the first holding plate having a plurality of cut-outs therein; and
    a stamped-out circuit comprising measuring lines configured to electrically connect the control device to the voltage taps, ones of the measuring lines being arranged in respective ones of the cut-outs in the first holding plate that correspond to the shape of the measuring lines,
    wherein control device-side ends of the measuring lines extend out of the cut-outs at ends of the cut-outs in a direction perpendicular to a surface of the first holding plate to be at a height of the second holding plate, the ends of the ones of the cut-outs being spaced from the respective ones of the voltage taps in a direction parallel to the surface of the first holding plate, and
    wherein the second holding plate covers the cut-outs in the first holding plate such that the measuring lines are contained in the cut-outs.

2. The device of claim 1, wherein the voltage taps are arranged in the cut-outs of the first holding plate.

3. The device of claim 2, further comprising holding elements configured to hold the voltage taps in the cut-outs of the first holding plate.

4. The device of claim 3, wherein the holding elements comprise elastic holding elements.

5. The device of claim 1, wherein the voltage taps are at least partially covered by the second holding plate.

6. The device of claim 1, wherein the second holding plate comprises maintenance orifices in a region of the voltage taps.

7. The device of claim 1, wherein the control device is structurally integrated in the holding plate.

8. The device of claim 7, wherein the control device is arranged on the first holding plate.

9. The device of claim 1, wherein the second holding plate comprises a control device orifice in a region of the control device.

10. The device of claim 1, further comprising a plug-connector configured to directly connect the control device to the measuring lines.

11. The device of claim 10, wherein the control device is directly connected to the measuring lines at the control device-side ends of the measuring lines.

12. The device of claim 1, wherein the control device-side ends of the measuring lines comprise male connectors configured to connect to corresponding female connectors of the control device.

13. The device of claim 1, wherein the second holding plate comprises a stop adjacent the control device, the stop being configured to block a horizontal displacement of the measuring lines.

14. A battery module comprising:
    a plurality of battery cells, each of the battery cells comprising connection terminals;
    a control device configured to monitor voltages of the battery cells;
    voltage taps electrically connected to the connection terminals to tap the voltages of the battery cells;
    a first holding plate and a second holding plate, the first holding plate having a plurality of cut-outs therein; and
    a stamped-out circuit comprising measuring lines configured to electrically connect the control device to the voltage taps, ones of the measuring lines being arranged in respective ones of the cut-outs in the first holding plate and extending along a direction parallel to a surface of the first holding plate,
    wherein the cut-outs are covered by the second holding plate such that the measuring lines are contained in the cut-outs, and
    wherein control device-side ends of the measuring lines extend out of the cut-outs in a direction perpendicular to the surface of the first holding plate to be at a height of the second holding plate at an end of each of the cut-outs, the end of each of the cut-outs being spaced from the respective voltage tap in the direction parallel to the surface of the first holding plate.

15. The battery module of claim 14, wherein the voltage taps are arranged in the cut-outs of the first holding plate.

16. The battery module of claim 15, further comprising holding elements configured to hold the voltage taps in the cut-outs in the first holding plate.

17. The battery module of claim 14, further comprising a plug-connector configured to directly connect the control device to the measuring lines.

18. The battery module of claim 14, wherein the control device-side ends of the measuring lines comprise male connectors configured to connect to corresponding female connectors of the control device.

19. The battery module of claim 14, wherein the second holding plate comprises a stop adjacent the control device, the stop being configured to block a horizontal displacement of the measuring lines.

* * * * *